(12) United States Patent
Wohlfahrt et al.

(10) Patent No.: US 6,639,824 B1
(45) Date of Patent: Oct. 28, 2003

(54) MEMORY ARCHITECTURE

(75) Inventors: Joerg Wohlfahrt, Kanagawa (JP);
Norbert Rehm, Kanagawa (JP);
Michael Jacob, Kanagawa (JP);
Thomas Roehr, Kanagawa (JP)

(73) Assignee: Infineon Technologies Aktiengesellschaft, Munich (DE)

( * ) Notice: Subject to any disclaimer, the term of this patent is extended or adjusted under 35 U.S.C. 154(b) by 0 days.

(21) Appl. No.: 10/065,126

(22) Filed: Sep. 19, 2002

(51) Int. Cl.[7] .............................................. G11C 11/22
(52) U.S. Cl. ................... 365/145; 365/149; 365/189.09
(58) Field of Search .................. 365/145, 149, 365/189.09

(56) References Cited

U.S. PATENT DOCUMENTS 5,798,966 A * 8/1998 Keeney ................. 365/185.18
6,459,609 B1 * 10/2002 Du .............................. 365/145

* cited by examiner

Primary Examiner—Huan Hoang
(74) Attorney, Agent, or Firm—Dexter Chin

(57) ABSTRACT

An IC with memory cells arranged in groups is described. The memory cells, for example, are ferroelectric memory cells. The IC includes a variable voltage generator (VVG) for generating an output voltage having a different voltage level depending on a location of an addressed memory cell within the memory group is provided. By providing different voltage levels for reads and/or writes, signal loss caused by capacitances which is dependent on the location of the memory cell within the group can be avoided. This improves read and/or write operations in series memory architectures.

28 Claims, 4 Drawing Sheets

MEMORY ARCHITECTURE

BACKGROUND OF THE INVENTION

Ferroelectric metal oxide ceramic materials such as lead zirconate titanate (PZT) have been investigated for use in ferroelectric semiconductor memory devices. Other types of ferroelectric material, such as Strontium-bismuth-tantalate (SBT) or lead-lanthanum-zirconium-titanate (PLZT) may also be used. FIG. 1 shows a conventional ferroelectric memory cell 105 having a transistor 130 and a ferroelectric capacitor 140. A capacitor electrode 142 is coupled to a plateline 170 and another capacitor electrode 141 is coupled to the transistor which selectively couples or decouples the capacitor from a bitline 160, depending on the state (active or inactive) of a wordline 150 coupled to the transistor gate.

The ferroelectric memory stores information in the capacitor as remanent polarization. The logic value stored in the memory cell depends on the polarization of the ferroelectric capacitor. To change the polarization of the capacitor, a voltage which is greater than the switching voltage (coercive voltage) needs to be applied across its electrodes. An advantage of the ferroelectric capacitor is that it retains its polarization state after power is removed, resulting in a non-volatile memory cell.

FIG. 2 shows a plurality of memory cells arranged in a group 203. Such types of memory architectures are described in, for example, Takashima et al., "High Density Chain ferroelectric random access Memory (chain FRAM)", IEEEJrnl. of Solid State Circuits, vol.33, pp.787–792 (May 1998),which is herein incorporated by reference for all purposes. The group includes a plurality of memory cells, each comprising a transistor 230 coupled to a capacitor 240 in parallel, coupled in series. One end of the group is coupled to a bitline 250 while the other end is coupled to a plateline 270. The gates of the transistors are coupled to respective wordlines 250. The bitline is coupled to a sense amplifier circuit to facilitate memory accesses (e.g., reads and writes).

During standby or when the memory group is not selected for a memory access, the wordlines of the group are active to render the cell transistors of the group conductive. The capacitors of the group are shorted when transistors are conductive. To retrieve or read information from one memory cell of the group, a pulse (e.g., 2,5V) is provided at the plateline. The wordline corresponding to the row address of the memory access is deactivated, causing the transistor of the selected cell to be non-conductive. As a result, the pulse applies a potential across the capacitor of the selected cell. A signal corresponding to the information stored in capacitor is then placed on the bitline and sensed by a sense amplifier. The read access is destructive, requiring the signal sensed by the sense amplifier to be written back to the selected memory cell.

The present invention proposes an improved series memory architecture.

SUMMARY OF THE INVENTION

The invention relates generally to ICs in which memory cells are arranged in groups. In one embodiment, the memory cells comprise ferroelectric memory cells. A variable voltage generator (VVG) for generating an output voltage is provided. The VVG generates a different output voltage level based on the location of an addressed memory cell within the memory group to facilitate memory accesses.

In one embodiment, a plateline is coupled to a first end of the memory group. The plateline includes a plateline driver which is coupled to the VVG. The VVG provides the output voltage to the plateline during a read access, which provides a plateline pulse on the plateline. The magnitude of the plateline pulse depends on the location of the selected memory cell within the group.

A bitline coupled to a second end of the group. A sense amplifier, which includes write circuitry, is coupled to the bitline, the sense amplifier includes a write circuitry. In one embodiment, the VVG is coupled to the write circuitry to provide the output voltage to the write circuitry during a write access. The output voltage depends on the location of the accessed memory cell.

In an alternative embodiment, a VVG is coupled to both the sense amplifier and plateline driver to provide plateline voltages and write voltages having different voltage levels depending on the location of the accessed memory cell. Providing two separate VVG, one each for the sense amplifier and plateline driver is also useful. By providing different voltage levels for reads and/or writes, signal loss caused by capacitances which is dependent on the location of the memory cell within the group can be avoided. This improves read and/or write operations in series memory architectures.

DETAILED DESCRIPTION

The present invention relates to memory ICs employing a series architecture. In one embodiment, the memory ICs comprise ferroelectric memory cells. Other types of memory cells are also useful. It has been discovered that, within conventional series architectures, failures are not necessarily randomly distributed, but instead tend to be distributed at specific addresses. These failing addresses correspond to memory cells located at or near the ends of the memory group.

The reason for non-distributed address failure is due to how read and write operations occurred in series architectures. To retrieve information from a memory cell of a group, a pulse is provided on the plateline. The pulse is, for example, 2,5V. All the cell transistors of the group, except for the selected cell, are conductive. The pulse travels along a signal path across the unselected cell transistors to the capacitor of the selected cell.

However, each cell transistor channel has some resistance, causing the pulse to be reduced. The more channels the pulse has to traverse to reach the selected cell, the smaller the pulse becomes. In the case of write access, the write signal from the sense amplifier has to travel from the bitline end of the group to the selected cell. The more transistors which need to be traversed to reach the selected cells, the smaller the write signal becomes. The reduced plateline pulse or write signal associated with memory cells located at or nearer to the ends of the group increases the likelihood of failures.

In accordance with one embodiment of the invention, the problems related to reduced plateline pulse and write signals are avoided by providing a variable plateline pulse and/or write signal, depending on the location of the selected cell. For example, a plateline pulse with a larger magnitude is used to read a memory cell located farther away from the plateline end of the group compared to that of a memory cell which is closer. For a write access, a write signal with higher magnitude is provided to write information to a memory cell located farther away from the bitline end of the compared to one which is closer. Increasing the plate line pulse and/or write signal compensates for signal loss due to the transistors in series architectures. The series architecture can be arranged in 1 transistor and 1 capacitor or 2 transistors 2 capacitors modes.

Figure 1:
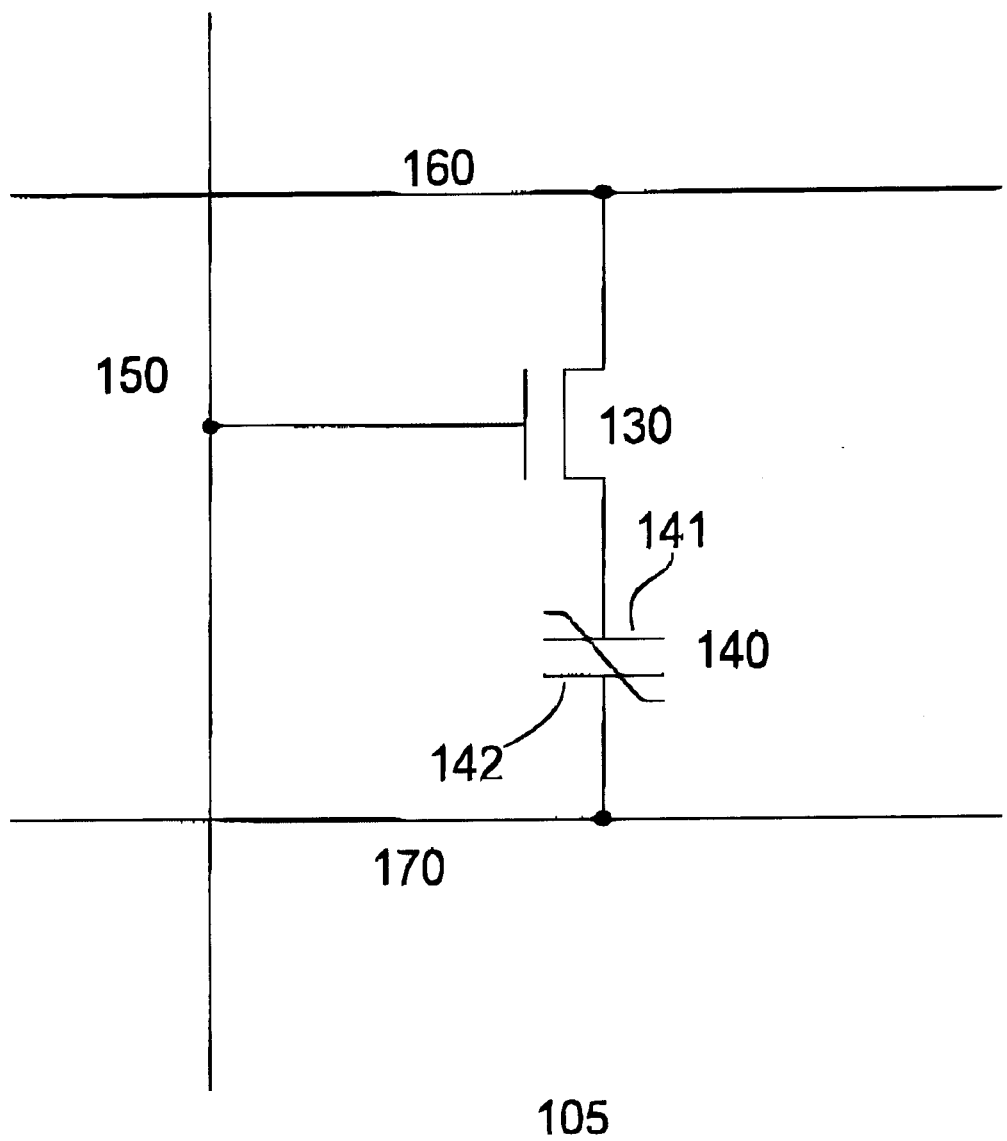
FIG. 1 shows a conventional ferroelectric capacitor.
Figure 2:
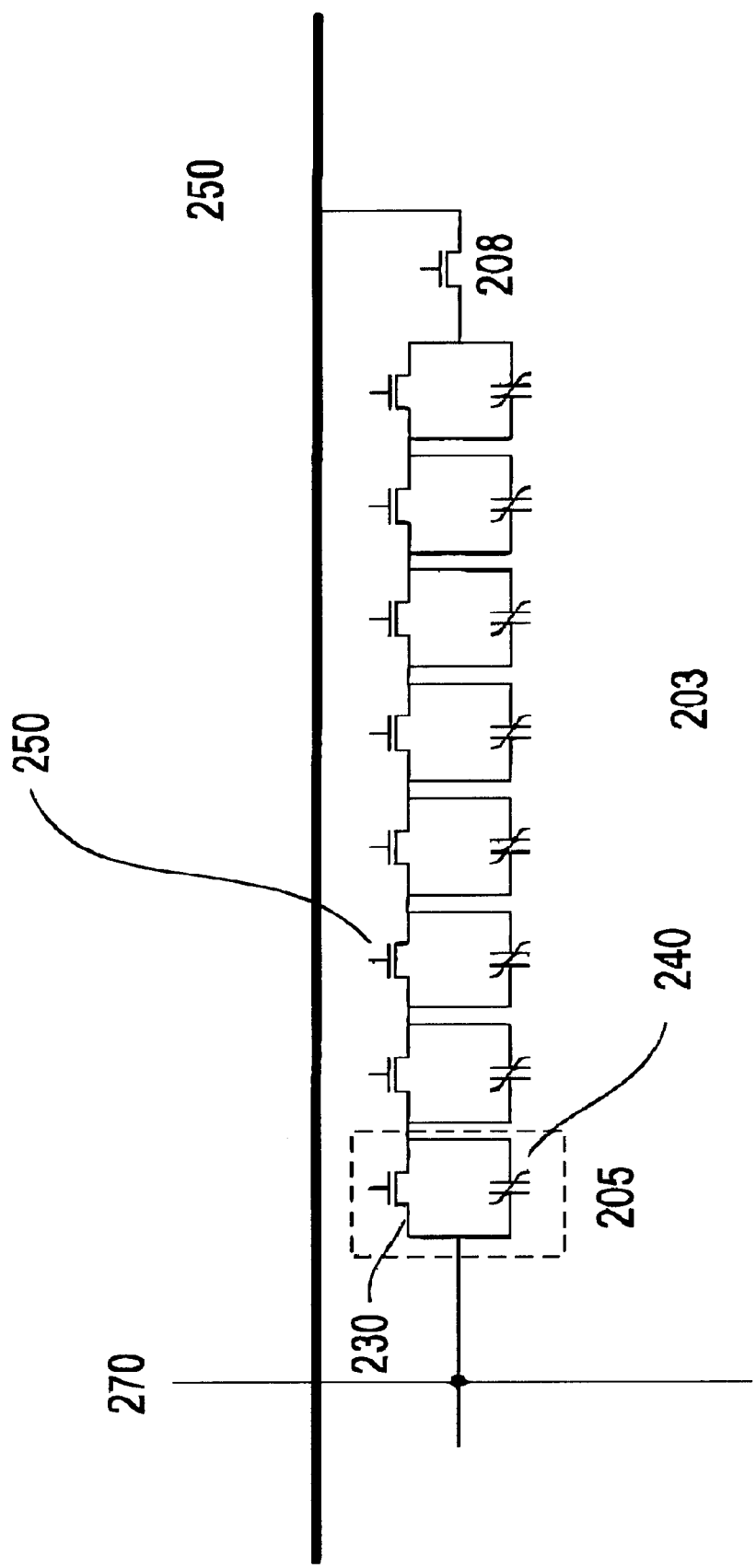
FIG. 2 shows a plurality of memory cells arranged in a group.
Figure 3:
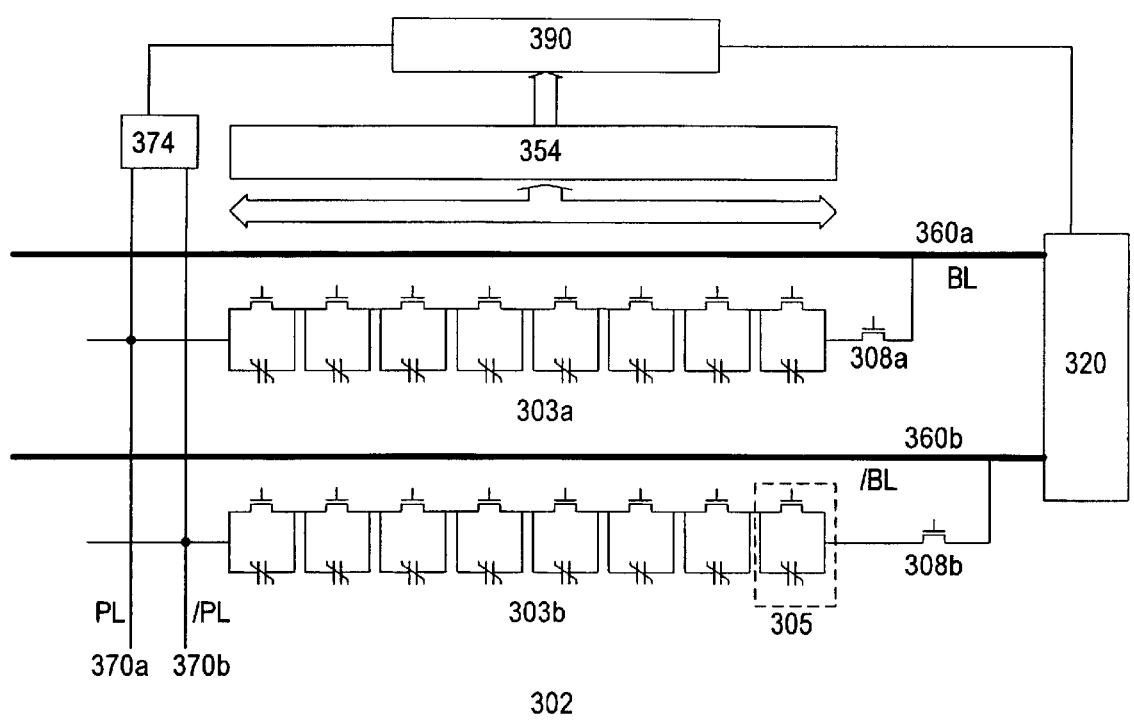
FIG. 3 shows the schematic diagram of the series architecture in accordance with one embodiment of the invention.

FIG. 3 shows a portion 302 of a memory array in accordance with one embodiment of the invention. The portion includes a plurality of memory cells 305 arranged in groups 303. Illustratively, a memory group comprises 8 memory cells. Providing a memory group with other numbers of memory cells is also useful. A memory cell includes a transistor coupled to a capacitor in parallel. The transistor, for example, is an n-FET. Alternatively, p-FETs can be used. One end of a group is coupled to a bitline 360 while the other end is coupled to a plateline 370. The gates of the transistors are coupled to respective wordlines. Each wordline of the group corresponds to a unique wordline or row address.

As shown, the portion includes first and second groups 303a–b coupled to respective bitlines, forming a bitline pair of a memory array or block. A selection transistor 308 is provided to selectively couple the group to the bitline. One bitline is referred to as bitline true (BL) and the other is referred to as the bitline complement (/BL). The group coupled to BL is coupled to plateline true (PL) and the group coupled to /BL is coupled to plateline complement (/PL). One memory cell from the bitline pair is selected during a memory access. The selection transistor couples the group on which the selected cell is located to the bitline.

A wordline decoder 354 is provided. In one embodiment, the wordline decoder includes drivers coupled to the wordlines. The wordline decoder receives the row portion of an address associated with the memory access and decodes it. The wordline associated with the decoded address is selected. In the case of a series architecture, the selected wordline renders the transistor to which it is coupled to non-conductive. In one embodiment, the selected wordline is driven to a logic 0 to render the n-FET of the memory cell non-conductive. For memory cells with p-FET, the wordline decoder drives the selected wordline to a logic 1.

A plateline driver 374 is coupled to the platelines. The plateline driver generates a pulse ($V_{PL}$) during a read access to provide an electric field across the selected capacitor. The magnitude of the pulse at the capacitor, for example, is about 2.5V. A sense amplifier circuit 320 is coupled to the bitline pair. The sense amplifier circuit includes, in one embodiment, read and write circuitry to facilitate memory accesses. For example, the sense amplifier circuit includes a sense amplifier, precharge circuitry and a write amplifier. The write amplifier generates a voltage ($V_{aa}$) corresponding to the information to be written to the memory cell. For example, $V_{aa}$ is either a logic 0 or logic 1.

A variable voltage generating circuit (VVGC) 390 is coupled to the row decoder. The VVGC is capable of generating different voltage levels. The VVGC, for example, comprises a regulated voltage source and resistive dividers. Other techniques for generating different voltage levels are also useful. The VVGC receives an input signal from the row decoder corresponding to the location of the selected memory cell. An output voltage corresponding to $V_{VR}$ is generated in response to the input signal. In one embodiment, the magnitude of $V_{VR}$ is dependent on the input from the row decoder (e.g., decoded row information or location of the selected memory cell within the group).

In one embodiment, the VVGC is coupled to the plateline driver. The VVGC provides $V_{VR}$ to the plateline driver, which corresponds to $V_{PL}$. This results in $V_{PL}$ having a different magnitude based on the row address or location of the selected memory cell within the group. In one embodiment, the magnitude of $V_{PL}$ is larger for accessing memory cells farther away from the plateline end of the group than that for accessing memory cells closer to the plateline end. By varying the magnitude of $V_{PL}$ base on row address information, plateline signal loss due to channel resistance is reduced or minimized.

The plateline signal, in one embodiment, is varied according to the row address information during read accesses such that the effective pulse signal ($V_{EFF}$) provided to the capacitor of the selected cell is within a desired range ($V_{DR}$), independent of the location of the selected cell within the group. $V_{DR}$ is defined by, for example, design parameters and capacitor material properties of the storage node. This, for example, allows for groups of cells to receive $V_{PL}$ having the same magnitude. Preferably, $V_{EFF}$ is substantially equal to the desired voltage ($V_{DES}$), independent of the location of the selected memory cell. In one embodiment, $V_{DES}$ is about 2.3V–2.7V. Other values of $V_{DES}$ can also be used, depending on device and material performance.

In one embodiment, the magnitude of $V_{PL}$ is increased to compensate for the voltage loss resulting form channel resistance of transistors of memory cell located between the plateline end of the group and the selected cell. The magnitude of the signal loss per memory cell can be determined by the resistance of the transistor channel of a memory cell. As such, $V_{PL}$ can be increased as necessary to compensate for the signal loss.

In another embodiment, the VVGC is also coupled to the write circuitry of the sense amplifier circuit. Providing a separate VVGC to the write circuitry is also useful. The VVGC provides a variable voltage ($V_{VW}$) to the write circuitry which corresponds to $V_{aa}$. The magnitude of a logic 1 $V_{VW}$ depends on the row address of the selected memory cell. In one embodiment, the magnitude of the logic 1 $V_{aa}$ is larger for accessing memory cells farther away from the bitline end of the group than that for accessing memory cells closer to the bitline end. By varying the magnitude of $V_{aa}$ base on row address information, write signal loss due to channel resistance is reduced or minimized.

The write signal, in one embodiment, is varied based on the row address information during write accesses such that the effective write signal ($V_{EFFW}$) provided to the capacitor of the selected cell is within a desired range ($V_{DW}$), independent of the location of the selected cell within the group. $V_{DW}$ is defined by, for example, design parameters. This, for example, allows for groups of cells to receive $V_{aa}$ having the same magnitude. Preferably, $V_{EFFW}$ is substantially equal to the desired voltage ($V_{DW}$), independent of the location of the selected memory cell. In one embodiment, $V_{DW}$ is about 2.3V–2.7V. Other values for $V_{DW}$ are also useful, depending on device and material performance.

In one embodiment, the magnitude of $V_{aa}$ is increased to compensate for the voltage loss resulting from channel resistance of transistors of memory cell located between the plateline end of the group and the selected cell. The magnitude of the signal loss per memory cell can be determined by the resistance of the transistor channel of a memory cell.

As such, $V_{aa}$ can be increased as necessary to compensate for the signal loss.

Figure 4:
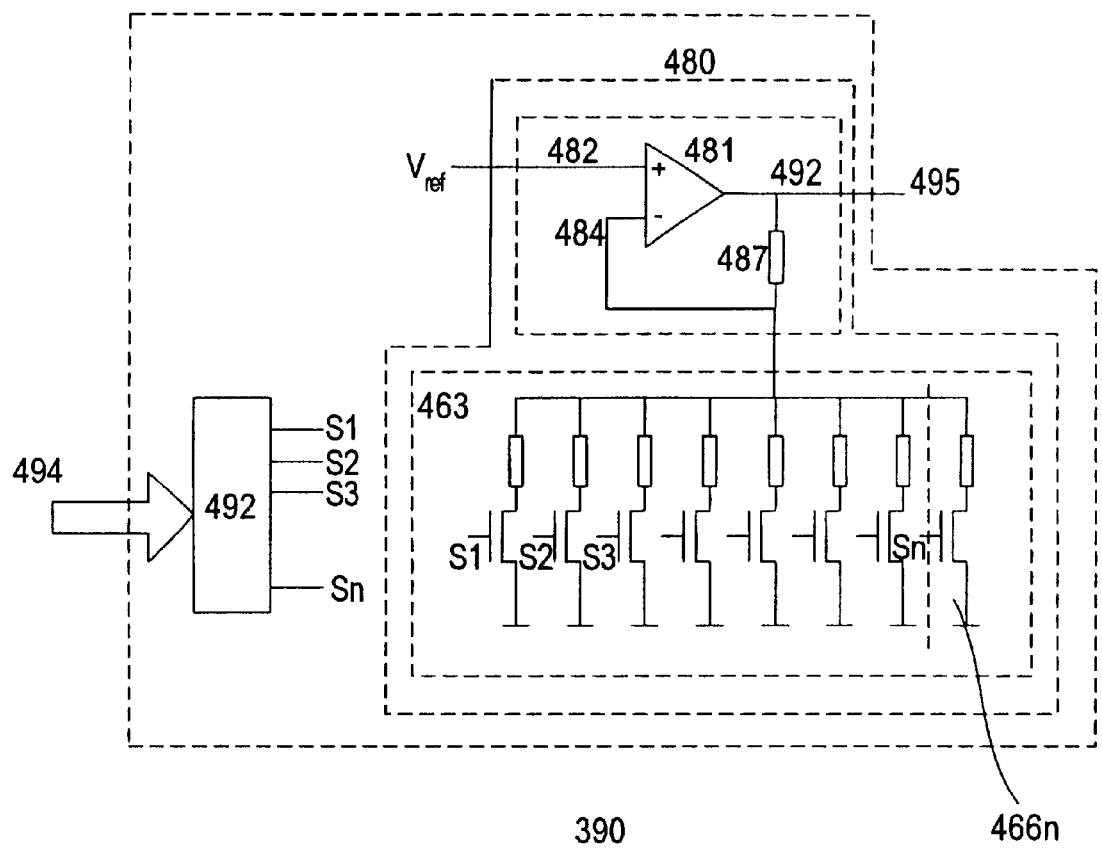
FIG. 4 shows a plateline voltage circuit in accordance with one embodiment of the invention.

FIG. 4 shows a VVGC 390 in accordance with one embodiment of the invention. As shown, the VVGC generates an output 495 in response to an input signal 494. The VVGC comprises a voltage regulating stage 480 having an amplifier 481 coupled to resistive divider 463. The amplifier includes first and second input terminals 482 and 484 and an output terminal 492. The output terminal of the amplifier is coupled to the output of the VVGC. A reference voltage $V_{ref}$ is coupled to the first input and the second input is coupled to the amplifier output terminal, creating a feed back loop. The feed back loop includes a feed back loop resistor 487.

The output of the resistive divider is coupled to the feed back loop between the feed back resistor and second amplifier input. The resistive divider comprises a plurality of parallel resistive paths $466_{1-n}$ coupled to the divider output and ground. A resistive path comprises a resistor and a switch. In one embodiment, the switch comprises a transistor, such as n-FET. Other types of switches are also useful. When the switch is activated, the resistive path is selected and is coupled to the amplifier feed back loop. The output of the amplifier circuit is equal to $V_{ref}$(feed back loop resistor/resistor of selected divider path +1). In one embodiment, the resistors of each path have different resistance values, causing the amplifier to produce a different output voltage depending on which path is selected.

In one embodiment, n is selected to equal the number of different voltage levels desired. In one embodiment, n is equal to the number of memory cells of a group. Providing n having different number than the cells of a group is also useful. The value of each resistor is selected to produce the desired voltage in accordance with one embodiment of the invention. A decoder 492 is provided for receiving the input signal. In one embodiment, the input signal is decoded to select one of the resistive paths for coupling to the sense amplifier. In one embodiment, the input signal represents addressing information to indicate which memory cell of the group is selected. The input signal should have at least sufficient number of bits to select one of the resistive paths. In one embodiment, the input signal comprises bits, where $2^x$ is at least equal to n and preferably equal to n.

One advantage of the invention is that the comparator voltage for the sense amplifier can still be kept constant and as stable as possible as the implemented interfaces do not impact upon the operation of the sense amplifier.

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. An integrated circuit comprising:
    a plurality of memory cells coupled in series to form a memory group;
    a plateline coupled to a first end of the memory group; and
    a variable voltage generator (VVG) for generating an output voltage, the output voltage has a different output voltage level depending on a location of an addressed memory cell within the memory group, the output voltage provided at the plateline during memory access.

2. The integrated circuit of claim 1 wherein the memory cells are ferroelectric memory cells.

3. The integrated circuit of claim 2 further comprises:
    a plateline driver coupled to the plateline, the plateline driver providing a plateline pulse on the plateline during read memory accesses; and
    the VVG coupled to the plateline driver, the VVG generates the output voltage to the plateline driver to provide the plateline pulse having different voltage level depending on the location of the accessed memory cell.

4. The integrated circuit of claim 3 wherein the plateline pulse is higher for accessing a memory cell located farther away from the first end than the plateline pulse for accessing a memory cell located closer to the first end.

5. The integrated circuit of claim 4 wherein the VVG generates the output voltage to provide the plateline pulse at the accessed memory cell having an effective plateline voltage value which is within a desired plate voltage range.

6. The integrated circuit of claim 4 wherein the VVG generates the output voltage to provide an effective plateline pulse to the accessed memory cell which is equal to a desired plate voltage.

7. The integrated circuit of claim 2 further comprises:
    a bitline coupled to a second end of the group;
    a sense amplifier coupled to the bitline, the sense amplifier includes a write circuitry; and
    the VVG coupled to the write circuitry, the VVG generates the output voltage to the write circuitry during a write access to provide a write voltage signal having different voltage level, depending on the location of the accessed memory cell.

8. The integrated circuit of claim 7 wherein the write voltage signal is higher for accessing a memory cell located farther away from the second end than the write voltage signal for accessing a memory cell located closer to the second end.

9. The integrated circuit of claim 8 wherein the VVG generates the output voltage to provide the write signal having an effective write signal value at the accessed memory cell which is within a desired write voltage range.

10. The integrated circuit of claim 8 wherein the VVG generates the output voltage to provide the write signal having an effective write signal value which is equal to a desired write voltage.

11. The integrated circuit of claim 1 further comprises:
    a plateline driver coupled to the plateline, the plateline driver providing a plateline pulse on the plateline during read memory accesses; and
    the VVG coupled to the plateline driver, the VVG generates the output voltage to the plateline driver to provide the plateline pulse having different voltage level depending on the location of the accessed memory cell.

12. The integrated circuit of claim 11 wherein the plateline pulse is higher for accessing a memory cell located farther away from the first end than the plateline pulse for accessing a memory cell located closer to the first end.

13. The integrated circuit of claim 12 wherein the VVG generates the output voltage to provide the plateline pulse at the accessed memory cell having an effective plateline voltage value which is within a desired plate voltage range.

14. The integrated circuit of claim 12 wherein the VVG generates the output voltage to provide an effective plateline pulse to the accessed memory cell which is equal to a desired plate voltage.

15. The integrated circuit of claim 1 further comprises:
    a bitline coupled to a second end of the group;

a sense amplifier coupled to the bitline, the sense amplifier includes a write circuitry; and the VVG coupled to the write circuitry, the VVG generates the output voltage to the write circuitry during a write access to provide a write voltage signal having different voltage level, depending on the location of the accessed memory cell.

16. The integrated circuit of claim 15 wherein the write voltage signal is higher for accessing a memory cell located farther away from the second end than the write voltage signal for accessing a memory cell located closer to the second end.

17. The integrated circuit of claim 16 wherein the VVG generates the output voltage to provide the write signal having an effective write signal value at the accessed memory cell which is within a desired write voltage range.

18. The integrated circuit of claim 16 wherein the VVG generates the output voltage to provide the write signal having an effective write signal value which is equal to a desired write voltage.

19. A method for operating an integrated circuit comprising:

providing a plurality of memory cells interconnected by platelines, bitlines and wordlines; and during a read memory access to one of the memory cells, generating a read pulse on at least one of the platelines associated with the one memory cell accessed, the read pulse comprises a different voltage level depending on a location of the memory cell accessed.

20. The method of operating the integrated circuit of claim 19 wherein generating the read pulse generates an effective read pulse at the accessed memory cell to equal to about a desired read voltage range or voltage level.

21. The method of operating the integrated circuit of claim 19 wherein providing the plurality of memory cells comprises providing the plurality of memory cells arranged in a series architecture, wherein the memory cells are separated into groups, cash group comprising memory cells coupled in series and having first and second ends, the first end coupled to one plateline and the second end coupled to one bitline.

22. The method of operating the integrated circuit of claim 19 wherein generating the read pulse generates an effective read pulse at the accessed memory cell to equal to about a desired read voltage range or voltage level.

23. The method of operating the integrated circuit of claim 19 wherein providing the plurality of memory cells comprises providing a plurality of ferroelectric memory cells.

24. The method of operating the integrated circuit of claim 23 wherein generating the read pulse generates an effective read pulse at the accessed memory cell to equal to about a desired read voltage range or voltage level.

25. The method of operating the integrated circuit of claim 23 wherein providing the plurality of memory cells comprises providing the plurality of memory cells arranged in a series architecture, wherein the memory cells are separated into groups, each group comprising memory cells coupled in series and having first and second ends, the first end coupled to one plateline and the second end coupled to one bitline.

26. The method of operating the integrated circuit of claim 25 wherein generating the read pulse generates an effective read pulse at the accessed memory cell to equal to about a desired read voltage range or voltage level.

27. The method for operating the integrated circuit of any of the claims 19–26 wherein during a write access one of the memory cells, generating a write signal on at least one of the bitlines associated with the one memory cell accessed, the write pulse comprises a different voltage level depending on a location of the memory cell accessed.

28. The method of operating the integrated circuit of claim 27 wherein generating the write signal generates an effective write signal at the accessed memory cell to equal to about a desired write voltage range or voltage level.

* * * * *

UNITED STATES PATENT AND TRADEMARK OFFICE
CERTIFICATE OF CORRECTION

PATENT NO. : 6,639,824 B1
APPLICATION NO. : 10/065126
DATED : October 28, 2003
INVENTOR(S) : Joerg Wohlfahrt et al.

It is certified that error appears in the above-identified patent and that said Letters Patent is hereby corrected as shown below:

In Column 1, Line 45 - "(e.g., 2,5V)" should read -- (e.g., 2.5V) --

In Column 2, Line 50 - "example, 2,5V." should read -- example, 2.5V. --

In Column 3, Line 52 - "2.5V." should read -- 2.5V. --

Signed and Sealed this

Fourteenth Day of November, 2006

JON W. DUDAS
*Director of the United States Patent and Trademark Office*